United States Patent [19]
Thatcher et al.

[11] Patent Number: 5,968,191
[45] Date of Patent: Oct. 19, 1999

[54] METHOD AND APPARATUS FOR TESTING INTEGRATED CIRCUITS IN A MIXED-SIGNAL ENVIRONMENT

[75] Inventors: Carl Wilmer Thatcher, Lansdale, Pa.; Stig Herman Oresjo; John Elliott McDermid, both of Loveland, Colo.; Kenneth Paul Parker, Fort Collins, Colo.

[73] Assignees: Hewlett-Packard Company, Palo Alto, Calif.; Ford Motor Company, Dearborn, Mich.

[21] Appl. No.: 08/848,107

[22] Filed: Apr. 28, 1997

Related U.S. Application Data

[63] Continuation of application No. 08/526,218, Sep. 11, 1995, abandoned, which is a continuation of application No. 08/071,461, Jun. 2, 1993, abandoned.

[51] Int. Cl.$^6$ .................................................. G01R 31/28
[52] U.S. Cl. ............................................ 714/723; 327/90
[58] Field of Search .................................... 714/8, 25, 27, 714/30, 37, 39, 43, 44, 48, 56, 726, 727, 733, 735, 742; 364/488, 489, 490; 324/765; 326/16; 327/90, 40

[56] References Cited

U.S. PATENT DOCUMENTS

| | | | |
|---|---|---|---|
| 4,009,437 | 2/1977 | Lacher | 324/72.5 |
| 4,074,195 | 2/1978 | Hunt | 324/158 D |
| 4,241,307 | 12/1980 | Hong | 324/555 |
| 4,395,767 | 7/1983 | Van Brunt et al. | 371/25.1 |
| 4,509,008 | 4/1985 | Dasgupta et al. | 371/22.3 |
| 4,638,246 | 1/1987 | Blank et al. | 324/500 |
| 4,922,492 | 5/1990 | Fasang et al. | 371/22.1 |
| 5,070,296 | 12/1991 | Priebe | 324/73.1 |
| 5,202,625 | 4/1993 | Farwell | 324/158 R |
| 5,210,486 | 5/1993 | Wilson et al. | 324/158 R |
| 5,225,834 | 7/1993 | Imai et al. | 341/120 |
| 5,303,246 | 4/1994 | Anderson et al. | 371/22.3 |
| 5,418,470 | 5/1995 | Dagostino et al. | 324/763 |

FOREIGN PATENT DOCUMENTS

| | | |
|---|---|---|
| 2157837 | 10/1985 | United Kingdom . |
| 2180355 | 3/1987 | United Kingdom . |

OTHER PUBLICATIONS

Parker et al., Structure and Metrology for an Analog Testability Bus, Oct. 1993, pp. 309–317.
"A Framework For Design For Testability Of Mixed Analog/Digital Circuits", M. Jarwala et al, pp. 1351–1354, IEEE 1991 Custom Integrated Circuits Conference.
"Manufacturers consider a standard for mixed–signal test", Mixed Signals, Mar. 1992, p. 5.
"MSTest: A Framework for Analog Scan Design", by Richard Hulse, Gould/AMI, Meeting of IEEE, p. 1149.4 Working Group, Apr. 20, 1992.
"Keeping Mixed–Signal Tests in Sync.", by Jürgen Zapf, Test & Measurement World, Aug., 1992, pp. 57–64.
"Mixed–Signal Integrated Circuit Design–for–Testability", by Steve Dollens, 1992 Mixed–Signal Design Conference, The Washington Technology Center, 27 pp.
"A Framework For A Mixed–Signal Testability Bus", by Brian R. Wilkins, Meeting of IEEE, p. 1149.4, Working Group, Apr. 20, 1992, pp. 1–8.
"A Mixed Signal Analog Test Bus Framework", by Richard Hulse, Gould/AMI, 1 p.

*Primary Examiner*—Robert W. Beausoliel, Jr.
*Assistant Examiner*—Nadeem Iqbal

[57] ABSTRACT

A method and apparatus is disclosed for testing integrated circuit interconnect and measuring the value of passive component interconnecting the IC's. Each IC includes both analog and digital circuitry and is provided with a test access port and boundary scan architecture for selectively connecting components to an analog test bus and for testing for the integrity of interconnections. When connected with the test bus, a constant current is supplied to the component and the resulting voltage developed across the bus is used for identifying the value of the component. In a second embodiment each IC includes a pair of buses which permits measurement of the impedance of the switches connecting the components to the test bus.

22 Claims, 3 Drawing Sheets

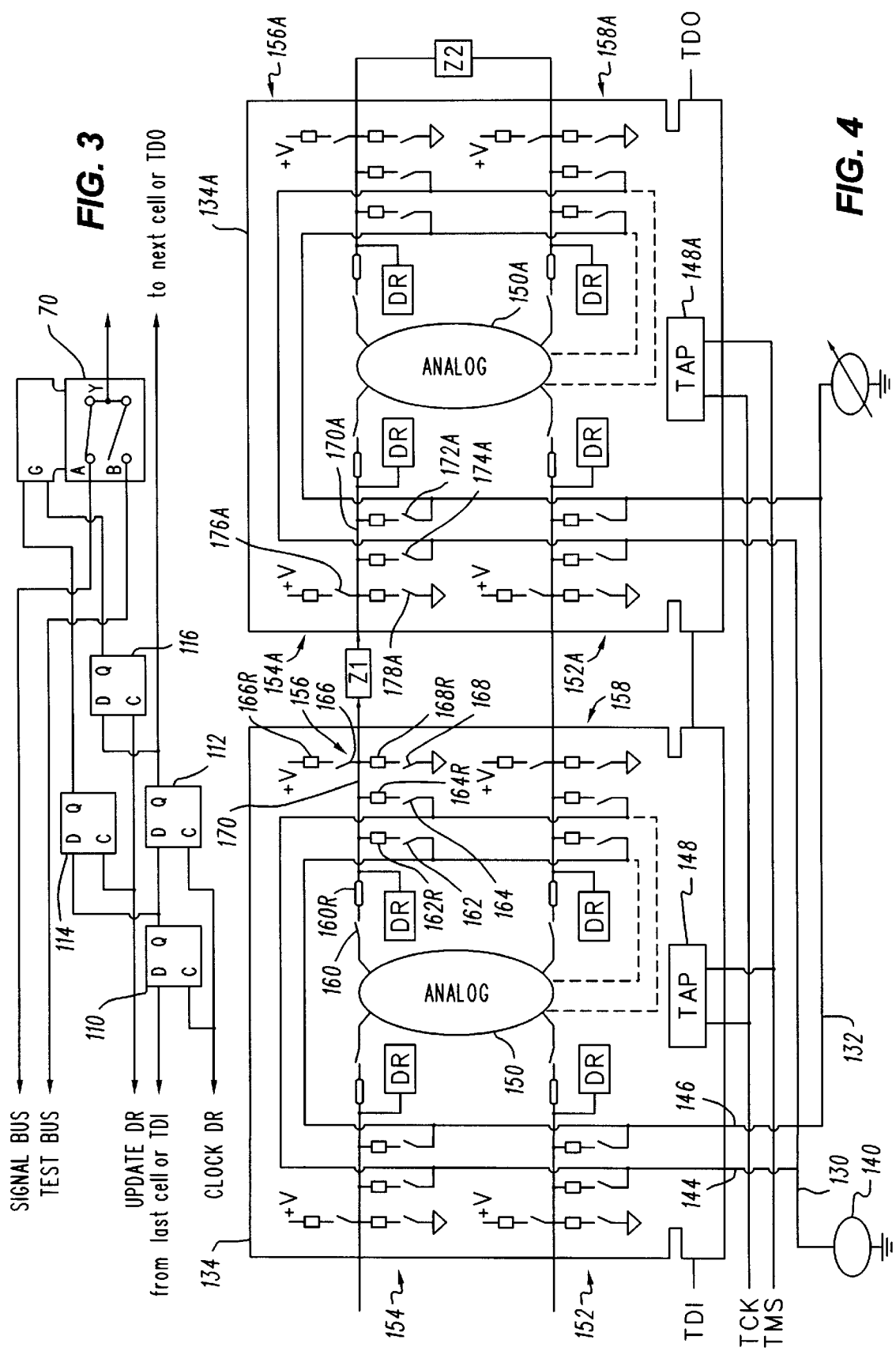

METHOD AND APPARATUS FOR TESTING INTEGRATED CIRCUITS IN A MIXED-SIGNAL ENVIRONMENT

CROSS REFERENCE TO RELATED APPLICATION(S)

This is a continuation of application Ser. No. 08,526,218 filed on Sep. 11, 1995, now abandoned.

Which is a continuation of application Ser. No. 08/071,461 filed on Jun. 2, 1993, now abandoned.

TECHNICAL FIELD

This invention relates to a method and apparatus for testing integrated circuits in a mixed signal environment and more particularly to testing interconnects between integrated circuits mounted on printed circuit boards and for measuring the value of electrical components interconnecting the integrated circuits.

BACKGROUND ART

A printed circuit board and system level interconnect test is a high priority need in industry. This is particularly so in the automotive industry where many different phases of electronic activity, from IC design to vehicle warranty and customer service, are present and thus involve several areas of testing and diagnostics. At the IC level a significant amount of testing of mixed-signal devices is required. In order to meet the electronic test and diagnostic needs of the automotive industry, the Design-for-Testability (DFT) real estate (both pin count and silicon) must be kept to a minimum in order for the cost to justify the benefits.

The extended period of vehicle warranty requires significant field test and diagnostic capability, and hierarchial testing concepts are required, beginning at the integrated circuit (IC) level and extending to the discrete components on mixed-signal boards and peripheral analog elements in control systems. The increasing trend to integrate greater capability into IC's, resulting in embedded complexities, has significantly reduced the effectiveness of the present in-circuit testing methods at the board level via a "bed of nails" interface. There is therefore a need to provide a "virtual in-circuit" testing at all levels over an analog test bus.

IC, subsystem and system level DFT approaches should entail structures that provide a means for testing for analog drift trends at critical locations within the IC's, PC boards and systems. Data paths to failure under harsh operating conditions are required to establish appropriate warranty data. Pertinent data feedback over the life of the product to all levels of the process would enhance continuous improvement and project future requirements amidst increasing complexities.

SUMMARY OF THE INVENTION

With the foregoing in mind, it is an object of the present invention to provide a method and apparatus for testing interconnects between integrated circuits which exist in a mixed signal environment.

It is a another object of the invention to provide for the measurement of passive components on printed circuit boards which components interconnect analog circuitry on separate IC's mounted on the board, wherein the measurement approach is compatible with boundary scan techniques used in prior art tests of digital integrated circuits.

In accordance with the present invention each IC is provided with multiplex switches for selectively connecting one or more electrical components, such as resistors, capacitors or conductors, either to core analog circuitry in two separate IC's or to a test bus on the IC's. The selection is accomplished by providing a digital test signal which connects the appropriate components to the test bus. In one embodiment each IC includes a single bus. When connected with the test bus, a programmable constant current is supplied to the component(s) and the resulting voltage developed across the bus is used for identifying the value of the component(s). In a second embodiment each IC includes a pair of buses which permits measurement of the impedance of the multiplex switches providing a more accurate measurement of the component values. Other switches and storage elements are provided on each IC for providing a digital test of the integrity of connections between pins on or between the IC's and for storing the result of the test.

BRIEF DESCRIPTION OF THE DRAWINGS

A more complete understanding of the present invention may be had from the following detailed description which should be read in conjunction with the drawings in which.

FIG. 3 is a schematic diagram showing greater detail of the switch control circuitry in FIG. 2;

FIG. 4 is a schematic diagram of a second embodiment of the invention;

DETAILED DESCRIPTION OF PREFERRED EMBODIMENT

Figure 1:
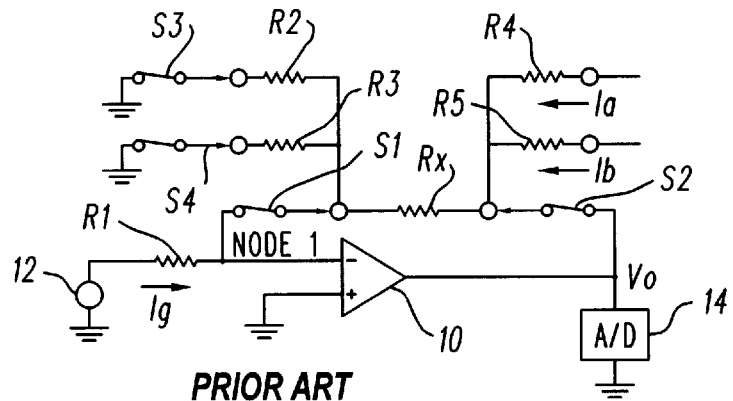
FIG. 1 is a diagram of a conventional in-circuit tester.

Referring now to the drawings and initially to FIG. 1, a conventional in-circuit tester employed in many manufacturing plants where printed circuit boards are tested, is shown. An operational amplifier having positive and negative inputs amplifies the difference between the two inputs by the gain of the circuit. Both inputs are extremely high impedance, and for most applications, they can be considered infinite in value. The op-amp is used to determine the value of analog components on the printed circuit board.

In the standard in-circuit tester, electromechanical switches make up a front-end matrix to interface the amplifier 10 to a probe assembly designed to match the printed circuit nodal pattern. The switches S1 and S2 (in the matrix) are closed as required to sequence each analog component to be tested into the feedback path of the amplifier 10. S3 and S4 (in the matrix) are closed to ground resistors R2 and R3. A constant voltage source 12 is connected with Node 1 through resistor R1. An unknown resistor Rx in the feedback path forms a voltage divider with R1 at Node 1. An analog-to-digital converter 14 measures the output voltage (Vo) of the amplifier 10. With the positive input tied to a reference voltage (ground), the negative input (Node 1) becomes a virtual ground due to the amplifier forcing current through Rx until the voltage difference across the two inputs is essentially zero. For instance, if the negative input tends to move positive, the output will be amplified in the opposite direction until the potential between the two inputs is essentially zero. If indeed Node 1 is virtual ground, and resistors R2 and R3 have zero potential across them, then all of the current from source 12 (Ig) must go through Rx. The amplifier 10, voltage source 12 and resistor R1 form a constant current source. Since Ig is known and Vo is measured, Rx can be calculated. Excess current from the amplifier 10 (I$a$ and I$b$) go through resistors R4 and R5, but have no effect on the calculation.

Figure 2:
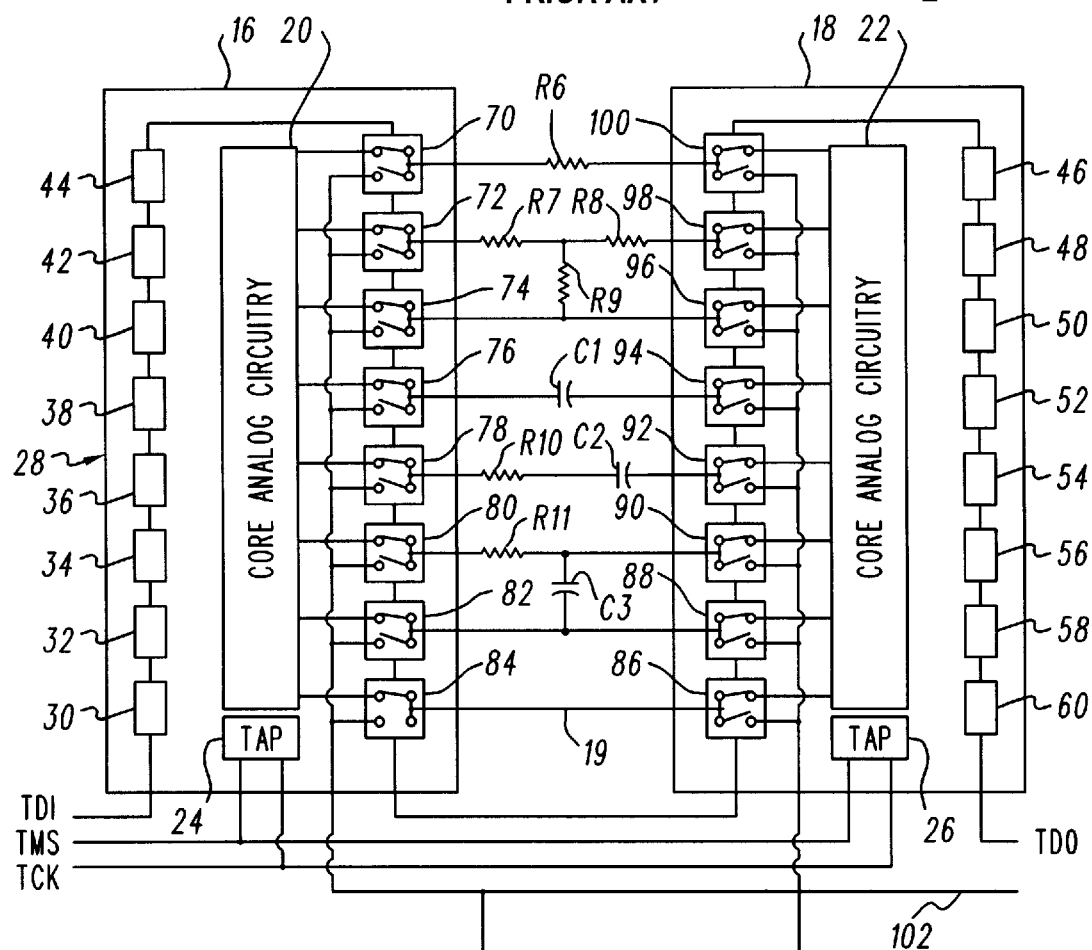
FIG. 2 is a schematic diagram of the present invention applied to a printed circuit board environment.

Referring now to FIG. 2, a portion of the in-circuit tester of FIG. 1 is used in accordance with the present invention to test the integrity of the interconnections between a pair of mixed-signal integrated circuits 16 and 18 and to measure passive components such as resistors R6–R11 and capacitors C1–C3, or a conductor 19 between the IC's. These components are mounted on a printed circuit board, which also supports the IC's 16 and 18. The IC's 16 and 18 include core or "mission" analog circuitry 20 and 22 as well as digital circuitry, not shown. A Test Access Port (TAP) control circuitry, generally designated 24 and 26, is provided on each IC 16 and 18 respectively. The TAP's 24 and 26 receive a Test Clock (TCK) and Test Mode Select (TMS) inputs and provide timing outputs, designated UPDATE DR and CLOCK DR in FIG. 3, which control a data register generally designated 28.

The register 28 includes eight stages 30–44 contained in IC 16 and eight stages 46–60 contained in IC 18. The data shifted through the register 28 controls multiplex devices 70–100 each of which includes a pair of switches. The devices 70–84 selectively connect the aforementioned passive board mounted components either to the input/output conductors of the analog circuitry 20, or to a test bus 102, a portion of which is contained within the IC 16 but accessible through a pin of the IC 16. Similarly, the devices 86–100 selectively connect the components either to the input/output conductors of the circuitry 22 or to a test bus 104. The position of the switches in the devices 70–100 is determined by a test vector or data word that is shifted in the register 28 via a Test Data In (TDI) line and shifted out via a Test Data Out (TDO) line all under the control of the TAP control circuitry 24 and 26. Node 1 at the negative input of the operational amplifier 10 is connected with the test bus 102 and the output of the amplifier 10 is connected with the test bus 104. When at least one of the devices 70–84 and one of the devices 86–100 is placed in a test mode position, a constant current from the generator 12 is fed through the closed switches to one or more of the passive components on the circuit board. The analog voltage developed at the output of the amplifier 10 is converted by the A/D converter 14 and fed to a computer 120 for determining the value of the component(s). The computer 120 also controls the programmable generator 12 to set the desired current level.

With reference to FIG. 3, each of the multiplex devices 70–100 may contain D-type flip-flops 110–116. The test vector is shifted through the register 28 and the flip-flop 110 and 112 in each multiplex devices. At any particular point in time one of four binary data pairs, 00,01,10, and 11 appear at the Q outputs of the flip-flops 110 and 112. When the desired test vector has been serially loaded, the UPDATE DR signal shifts the data at the Q outputs of the F/F's 110, 112 to the F/F's 114 and 116 respectively. The latched outputs of the F/F's control the gates of two FET switches respectively, to thereby select either the signal bus to the circuits 20 and 22 or the test buses 102 and 104.

There are significant differences between the on-board test IC of FIG. 2 and the external in circuit tester shown on FIG. 1. Some of these differences are as follows: 1) The on-board test opamp will not be powered by two power supplies, one for the positive voltage, and the other for the negative voltage. Instead, a protected voltage source derived from the vehicle battery (+V) would provide for both. 2) The positive input to the op-amp, stimuli and voltage measuring circuit could be referenced to a voltage equal to +V/2. 3) The switching matrix, probe assembly, interconnect wiring and associated control software in the in-circuit tester are no longer needed for the simpler IC integrated approach. This will reduce the cost of future testers.

Referring now to FIG. 4, a second embodiment of the invention is shown. In this embodiment an analog bus having input and output lines 130 and 132 respectively extend within each of the plurality of IC's 134, and 134A mounted on the printed circuit board. The additional bus on each IC adds an additional pin over the embodiment of FIG. 2, but provides offsetting advantages in accuracy of measurement of components, where the impedance of the multiplex switches is large. In order to conserve silicon real estate, the multiplex switches may be located on the IC so that relatively small amounts of silicon are used which will necessarily result in higher switch impedance values.

A current source generally designated 140 is connected with the bus 130 and a voltage detector generally designated 142 is connected with the bus 132. Alternatively, the source 140 could be a constant voltage source and the detector 142 would then be a current detector. Regardless of their identities, the source 140 is used to impart a test stimulus to bus 130, and the detector 142 is used to detect an analog response to the test stimulus on bus 132, as will be more fully described below. Buses 130 and 132 may at times be referred to as "internal analog test buses". The IC 134 includes conductors 144 and 146 which connect with the buses 130 and 132 respectively and to a plurality of switches. These switches are actuable to either an open or closed position under the control of test circuitry in a Test Access Port (TAP) 148 as previously discussed. The control circuitry includes a boundary-scan register (not shown) as is well known in the art and includes a standard interface providing instructions for control of the switches. In FIG. 4, for purposes of illustration, each IC includes four groups of switches generally designated 152–158, and 152A–158A respectively. In the interest of brevity only group 156 will be discussed in detail. The switch group 156 includes switches 160–168. Associated with each switch is an internal impedance designated by the suffix "R". The switch 160 is actuable to connect or disconnect the analog circuit 150 with a conductor 170 connected with an externally accessible electrical contact point (e.g., an input pin of the IC 134). When a test mode is selected the switch 160 is opened. The switch may be contained within the analog circuit 150. For example, the function performed by the switch 160 may be performed by turning off the output driver of an operational amplifier forming a part of the circuit 150. In that case, it would be the responsibility of the IC designer to fabricate the appropriate level of control from the boundary scan test word. The switches 162 and 162 connect the conductor 170 to the bus 130 and 132 through the conductors 144 and 146 respectively. The switches 166 and 168 are connected with an IC operating voltage and ground (i.e., a reference relative to source 140 and the test stimulus which it imparts) respectively, and are provided to simulate the IEEE Standard 1149.1 EXTEST in a mixed-signal environment. Additionally, the switches corresponding to 168 in each switch group, provide a reference (ground) connection during measurement of the components Z1 and Z2 as discussed below. EXTEST is a connectivity test procedure for testing digital integrated circuits. Further details regarding EXTEST as well as background information may be had from the IEEE Standard Test Access Port and Boundary-Scan Architecture published by the IEEE, May 21, 1990. While not shown in FIG. 4, it will be understood that the IC's contain digital as well as analog circuits. Control of the switches 166 and 168 will for example permit the detection of a cross family short between an IC pin connected with analog circuitry and an IC pin connected with digital circuitry. By selective closure of the switches to +V or to ground a digital "1" or "0" can be generated and then detected by a data register which includes a stage DR, associated with each switch group.

By selective closure of the appropriate switches in the switch groups in IC's 134, and 134A, the component Z1 can be connected with the constant current source 140 and appropriate measurements can be made by the detector 142 in order to determine the impedance of the component(s). Considering, for example, the component Z1 and the switch group 156 in IC 134 and switch group 154A in IC 134A, the switch 164 is closed to connect one side of Z1 to the current source 140 and switch 178A is closed to connect the other side of Z1 to ground. The value of Z1 is determined by connecting the voltage detector 142 to the left side of Z1, by closure of switch 162, and measuring a voltage $V_3$, then opening the switch 162 and closing the switch 172A, connecting the voltage detector 142 to the right side of Z1 and measuring a voltage $V_4$. The value of Z1 is then the difference between the voltage measurements $V_3$ and $V_4$ divided by the constant current. Any switch impedance in series with Z1 will change $V_3$ or $V_4$ but not the difference $V_3$–$V_4$. The same metrology can be used to determine the value of Z2 though the closure of the appropriate switches in the switch groups 156A and 158A.

The dotted line extensions of the conductors 144 and 146 in IC 134, as well as the corresponding conductors in the IC 134A, are intended to indicate that, if desired, measurement can be made within the analog circuit 150.

Figure 5:
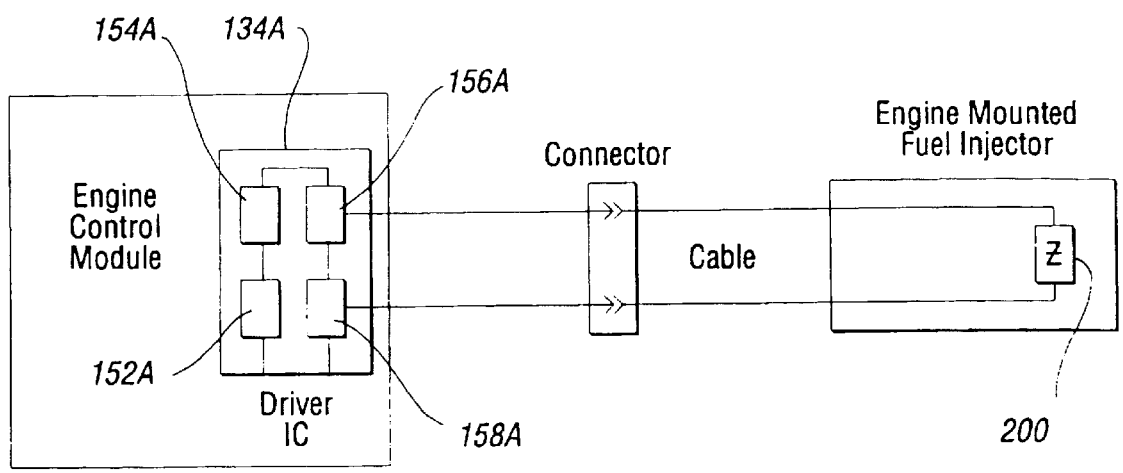
FIG. 5 is a block diagram showing application of the invention to the automotive system environment.

FIG. 5 shows the test bus extending beyond the control module board level into a typical subsystem such as an engine control module and to sensors or actuators connected with the module and existing in harsh environments. In the automotive electronic industry, a control module interfaces with many peripheral sensors for monitoring the many variations of conditions through which the system must operate. For example, in the engine control system the air-fuel ratio must be at the right mixture under all atmospheric conditions, whether it be for temperature, moisture, altitude, etc. Many actuators are involved to meter the fuel, adjust the spark timing, re-circulate crankcase fumes, etc. to assure quality operating vehicles. Drift in impedance through the interconnecting circuitry cannot be ignored. The harsh operating environments of temperature extremes, temperature cycles, anti-freeze spills, road salts, etc., all effect the aging process. The many interconnections making up the system must be measured for analog changes. The common trial and error practices of replacing a sensor or actuator, disconnecting cables for test, etc., masks many real conditions producing failures, and destroy any hope of identifying the failure mechanisms in the natural setting. In FIG. 5, the value of an electrical component forming an actuator 200 driven by IC 134A, can be measured using the approach shown in FIG. 4. The switch groups 156A and 158A can be selectively closed in order to connect the sensor 200 with the constant current source such as 140 of FIG. 4 and then voltage measurements on either side of the sensor are made using a voltage detector such as 142 of FIG. 4.

While the best mode for carrying out the invention has been described in detail, those familiar with the art to which this invention relates will recognized various alternative designs and embodiments for practicing the invention as defined by the following claims.

We claim:

1. Apparatus for measuring electrical component means which are external to and interconnected with first and second integrated circuit devices which devices include first and second analog circuits respectively, said apparatus comprising a first and a second analog test bus means included in said first and second devices respectively, multiplex means included in each of said devices for selectively connecting said component means either to said analog circuit means or to said analog test bus means, test circuit means connected with said first and second test bus means and including a source for supplying a current to said component means when said component means is connected with said test bus means and detector means for determining the value of said component means.

2. An integrated circuit device, comprising:
   a) core analog circuitry;
   b) an input/output pin;
   c) first and second analog test buses;
   d) switch means, comprising:
      i) a first switch connecting said pin to said core analog circuitry;
      ii) a second switch connecting said pin to said first analog test bus;
      iii) a third switch conneting said pin to said second analog test bus; and
   e) test circuitry for controlling the state of said switches so as to disconnect said pin from said core analog circuitry and selectively connect said pin with said first and/or second test buses.

3. An integrated circuit device as in claim 2, wherein:
   a) said switch means further comprises:
      i) a fourth switch connecting said pin to an integrated circuit operating voltage; and
      ii) a fifth switch connecting said pin to ground; and
   b) the integrated circuit further comprises a data register connected to said switch means.

4. An integrated circuit device as in claim 2, further comprising:
   a) a plurality of input/output pins; and
   b) a plurality of switch means, corresponding to the plurality of input/output pins, wherein each of the plurality of switch means comprises:
      i) a first switch connecting one of the plurality of input/output pins to said core analog circuitry;
      ii) a second switch connecting one of the plurality of input/output pins to said first analog test bus; and
      iii) a third switch connecting one of the plurality of input/output pins to said second analog test bus;
   wherein each of the plurality of switch means is controlled by the test circuitry.

5. An integrated circuit device as in claim 4, wherein:
   a) each of the plurality of switch means further comprises:
      i) a fourth switch connecting one of the plurality of input/output pins to an integrated circuit operating voltage; and
      ii) a fifth switch connecting one of the plurality of input/output pins to ground; and
   b) the integrated circuit further comprises a data register connected to each of the plurality of switch means.

6. An integrated circuit device as in claim 2, wherein the first and second analog test buses are interchangeable, and are designed so that one of the buses may be connected to a source means while the other is simultaneously connected to a detector means.

7. An integrated circuit, comprising:
a) a core;
b) a plurality of externally accessible electrical contact points comprising a first contact point;
c) means for disconnecting the first contact point from the core;
d) means for delivering a test stimulus to the first contact point;
e) means for obtaining an analog response to the test stimulus; and
f) means for connecting the first contact point to an integrated circuit operating voltage or reference relative to the test stimulus.

8. An integrated circuit as in claim 7, wherein the core comprises analog circuitry.

9. An integrated circuit as in claim 7, wherein the core comprises digital circuitry.

10. An integrated circuit as in claim 7, wherein each of various contact points within the plurality of externally accessible electrical contact points are associated with:
a) a means for disconnecting it from the core; and
b) a means for connecting it to an integrated circuit operating voltage or reference relative to the test stimulus.

11. An integrated circuit as in claim 7, wherein each of the plurality of externally accessible electrical contact points which is configured for analog input or output is associated with:
a) a means for disconnecting it from the core; and
b) a means for connecting it to an integrated circuit operating voltage or reference relative to the test stimulus.

12. An integrated circuit as in claim 11, wherein the means for delivering a test stimulus to the first contact point is configured to deliver a test stimulus to any of the plurality of externally accessible electrical contact points which is configured for analog input or output.

13. An integrated circuit as in claim 7, further comprising a data register connected to the first contact point.

14. An integrated circuit as in claim 13, wherein the data register is a digital device.

15. An integrated circuit as in claim 7, further comprising a Test Access Port, wherein the means for disconnecting the first contact point from the core, the means for delivering a test stimulus to the first contact point, the means for obtaining an analog response to the test stimulus, and the means for connecting the first contact point to an integrated circuit operating voltage or reference relative to the test stimulus, each comprise one or more programmable switches which are programmed in response to signals received at the Test Access Port.

16. An integrated circuit as in claim 15, further comprising a boundary-scan register, wherein:
a) the boundary-scan register is interconnected with each of the programmable switches; and
b) data is shifted into the boundary-scan register in response to signals received at the Test Access Port.

17. An integrated circuit as in claim 7, wherein the means for delivering a test stimulus to the first contact point, and the means for obtaining an analog response to the test stimulus, comprise a pair of interchangeable analog test buses.

18. A method of testing one or more electrical components which are interconnected between two or more electrical contact points located on one or more integrated circuits, comprising the steps of:
a) programming all integrated circuits having an electrical contact point connected to the one or more electrical components to disconnect their cores from said electrical contact points;
b) programming at least one of the integrated circuits having an electrical contact point connected to the one or more electrical components, contact A, to connect contact A to a reference;
c) programming one of the integrated circuits having an electrical contact point connected to the one or more electrical components, contact B, to deliver a test stimulus, relative to the reference, to contact B;
d) programming one or more of the integrated circuits having an electrical contact point connected to the one or more electrical components to output analog responses to the test stimulus; and
e) calculating values of the one or more electrical components using the analog responses to the test stimulus.

19. A method as in claim 18, wherein the one or more electrical components are interconnected between two electrical contact points located on one integrated circuit, and wherein the programming steps respectively comprise the steps of:
a) programming the one integrated circuit to disconnect its core from said two electrical contact points;
b) programming the one integrated circuit to connect a first of the two electrical contact points to a reference;
c) programming the one integrated circuit to deliver a test stimulus, relative to the reference, to a second of the two electrical contact points; and
d) programming the one integrated circuit to
   i) connect an analog test bus to the first of the two electrical contact points and output a first analog response to the test stimulus; and
   ii) connect the analog test bus to the second of the two electrical contact points and output a second analog response to the test stimulus.

20. A method as in claim 18, wherein the one or more electrical components are interconnected between first and second electrical contact points, respectively located on first and second integrated circuits, and wherein the programming steps respectively comprise the steps of:
a) respectively programming the first and second integrated circuits to disconnect their cores from the first and second electrical contact points;
b) programming the first integrated circuit to connect the first electrical contact point to a reference;
c) programming the second integrated circuit to deliver a test stimulus, relative to the reference, to the second electrical contact point; and
d) programming
   i) the first integrated circuit to connect an internal analog test bus to the first electrical contact point and output a first analog response to the test stimulus; and
   ii) the second integrated circuit to connect an internal analog test bus to the second electrical contact point and output a second analog response to the test stimulus.

21. A method as in claim 18, wherein all of the programming steps comprise the step of shifting data into a boundary scan register.

22. A method as in claim 18, wherein the step of programming one of the integrated circuits having an electrical contact point connected to the one or more electrical components to deliver a test stimulus to contact B comprises the step of connecting an internal analog test bus to contact B.

* * * * *